(12) United States Patent
Gwin

(10) Patent No.: US 7,274,567 B2
(45) Date of Patent: Sep. 25, 2007

(54) CAPILLARY TUBE BUBBLE CONTAINMENT IN LIQUID COOLING SYSTEMS

(75) Inventor: Paul J. Gwin, Orangevale, CA (US)

(73) Assignee: Intel Corporation, Santa Clara, CA (US)

( * ) Notice: Subject to any disclaimer, the term of this patent is extended or adjusted under 35 U.S.C. 154(b) by 315 days.

(21) Appl. No.: 11/157,239

(22) Filed: Jun. 21, 2005

(65) Prior Publication Data
US 2006/0283199 A1    Dec. 21, 2006

(51) Int. Cl.
*H05K 7/20* (2006.01)
(52) U.S. Cl. ............... 361/699; 165/80.3; 165/104.33; 257/714; 174/15.1
(58) Field of Classification Search ............... None
See application file for complete search history.

(56) References Cited

U.S. PATENT DOCUMENTS

| | | | | |
|---|---|---|---|---|
| 4,912,600 A | * | 3/1990 | Jaeger et al. ............... 361/700 |
| 5,048,599 A | | 9/1991 | Tustaniwskyj et al. | |
| 5,471,850 A | * | 12/1995 | Cowans ....................... 62/223 |
| 6,498,725 B2 | * | 12/2002 | Cole et al. ................... 361/700 |
| 6,687,122 B2 | * | 2/2004 | Monfarad ..................... 361/687 |
| 6,809,928 B2 | | 10/2004 | Gwin et al. | |
| 7,040,117 B2 | * | 5/2006 | Nishida et al. ................ 62/500 |
| 2006/0067052 A1 | | 3/2006 | Llapitan et al. | |

FOREIGN PATENT DOCUMENTS

GB    596 271 A    12/1947
JP    10 314503 A    12/1998

OTHER PUBLICATIONS

"PCT International Search Report of the International Searching Authority", mailed May 2, 2007, for PCT/US2006/024519, 3pgs.

* cited by examiner

*Primary Examiner*—Boris Chervinsky
(74) *Attorney, Agent, or Firm*—Buckley, Maschoff & Talwalkar LLC

(57) ABSTRACT

According to some embodiments, a capillary tube may be utilized to facilitate bubble containment in liquid cooling systems. For example, a system may comprise a first volume to contain a liquid, a second volume to contain the liquid and a gas, a capillary tube configured to hydraulically couple the first and second volumes, an inlet coupled to the first volume to receive the liquid from an electronics cooling system, and an outlet coupled to the first volume to provide the liquid to the electronics cooling system.

18 Claims, 4 Drawing Sheets

CAPILLARY TUBE BUBBLE CONTAINMENT IN LIQUID COOLING SYSTEMS

BACKGROUND

Liquid cooling systems are utilized to remove heat from a variety of electronic and other devices. Typical liquid cooling systems may comprise a cold plate to remove heat from an electronic device, a liquid-to-air heat exchanger to dissipate the heat (often facilitated by the use of a fan to promote forced convection), a pump to circulate a working liquid throughout the system, and a reservoir to provide a reserve of the liquid. Performance may be hampered, however, by the presence of a gas within the liquid cooling system. Poor hermetic seals and/or seepage of fluid (e.g., through hydroscopic plastic components) may, for example, introduce and/or enhance the presence of the gas within liquid flow paths. In some situations, a bubble of the gas may actually be desirable to facilitate liquid expansion and/or contraction within the system, yet this bubble may nevertheless interfere with system performance.

Some systems utilize methods to prevent the gas from traveling through the system as a single and/or large bubble. This may, for example, help decrease the risk of the pump losing prime. These smaller bubbles of the gas that do travel through the system, however, may cause undesirable noise, may still cause pump prime loss, and/or may become trapped in critical heat transfer zones, reducing system performance.

DETAILED DESCRIPTION

Some embodiments herein are associated with a "capillary tube". As used herein, the term "capillary tube" may generally refer to any channel, conduit, tube, pipe, and/or other path in which a liquid may experience and/or otherwise be associated with capillary forces. According to some embodiments, the diameter and/or other geometries or properties of the capillary tube may be configured and/or chosen to cause capillary forces to be dominant forces within the capillary tube. The liquid may, for example, be drawn and/or wicked through the capillary tube in a direction opposing other forces (e.g., gravity and/or pressure forces). In some embodiments, the presence of the liquid within the capillary tube and/or the capillary forces acting upon the liquid may substantially prevent other fluids (such as a gas) from entering and/or traveling within the capillary tube.

Figure 1:
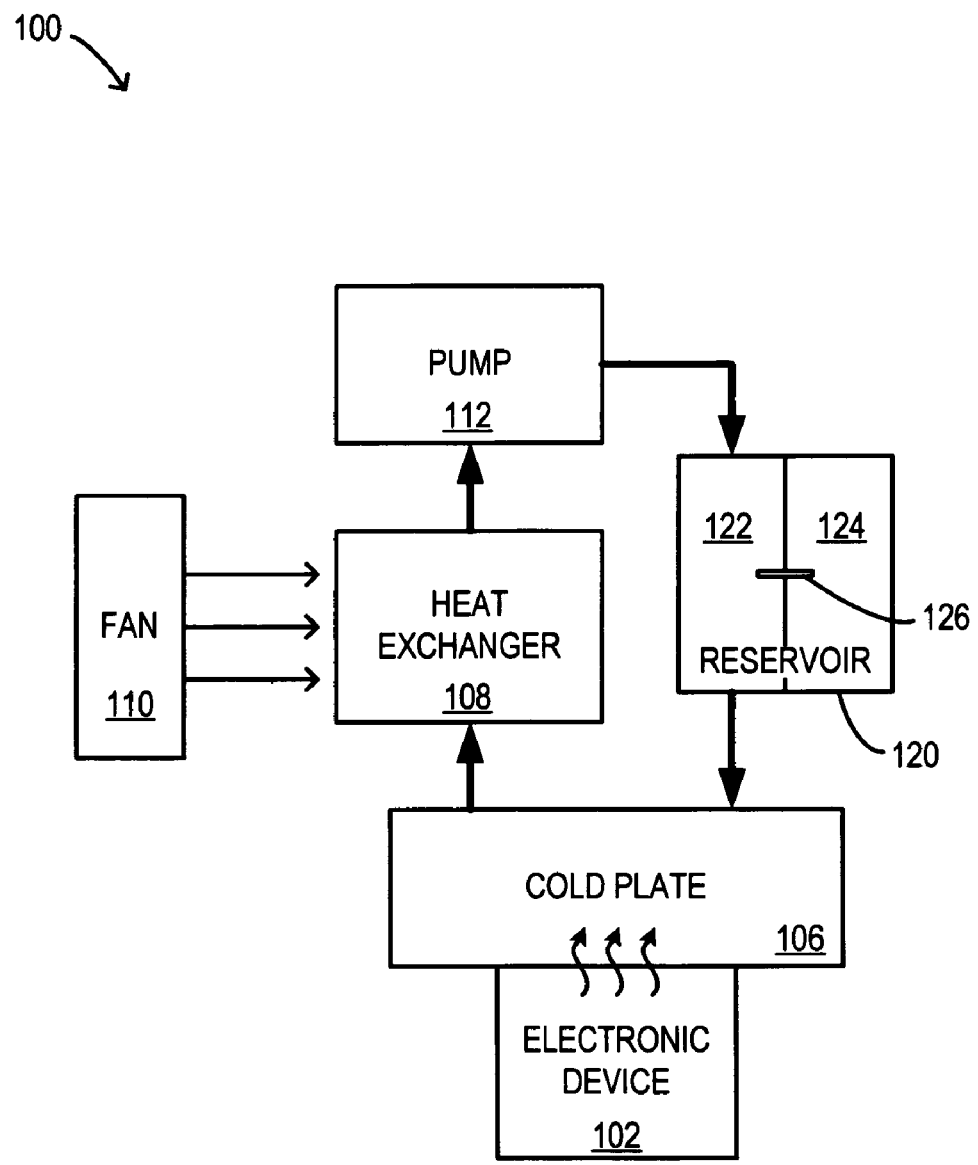
FIG. 1 is a block diagram of a system according to some embodiments.

Referring first to FIG. 1, a block diagram of a system 100 according to some embodiments is shown. The various systems described herein are depicted for use in explanation, but not limitation, of described embodiments. Different types, layouts, quantities, and configurations of any of the systems described herein may be used without deviating from the scope of some embodiments. Fewer or more components than are shown in relation to the systems described herein may be utilized without deviating from some embodiments.

The system 100 may comprise, for example, an electronic device 102 (such as a processor, memory device, a voltage regulator, etc.), a cold plate 106, a heat exchanger 108, a fan 110, a pump 112, and/or a reservoir 120. In some embodiments, the electronic device 102 may generate heat and/or may transfer heat to the cold plate 106. The cold plate 106 may, for example, be coupled to the electronic device 102 to accept and/or remove heat from the electronic device 102. Heat may travel through conduction, in some configurations, from the electronic device 102 to the cold plate 106 (e.g., as depicted via the wavy lines in FIG. 1).

In some embodiments, the cold plate 106 may transfer heat to the heat exchanger 108. The heat exchanger 108 may, for example, be a heat sink and/or radiator configured to expel and/or dissipate heat. In the case that the heat exchanger 108 comprises fins (not shown) for dissipating heat, for example, the fan 110 may facilitate the removal and/or dissipation of heat from the heat exchanger 108. The fan 110 may, in some configurations, direct air toward the heat exchanger 108 (and/or any fins thereof) to facilitate forced convection to remove heat from the heat exchanger 108. The system 100 may also or alternatively comprise the pump 112. The pump 112 may, according to some configurations, circulate a fluid within the system 100.

For example, the heat transferred by the electronic device 102 to the cold plate 106 may be directed to and/or transferred to (e.g., conducted to) a fluid and/or liquid (such as water and/or propylene glycol) that circulates through and/or over the cold plate 106. The heated liquid may then, for example, proceed to the heat exchanger 108 to transfer heat to the heat exchanger 108 and/or to otherwise dissipate the heat within the liquid. The heat exchanger 108 may, for example, remove heat from the liquid. The cooled liquid (e.g., cooled relative to the heated liquid and/or the cold plate 106) may then proceed to the pump 112. The pump 112 may, for example, comprise a centrifugal pump to move the liquid through the system 100. In some embodiments, the pump 112 may direct the liquid to the reservoir 120.

The reservoir 120 may, for example, store a quantity of the liquid for use in the system 100. According to some embodiments, the reservoir 120 may comprise and/or define a first volume 122 and/or a second volume 124. The first volume 122 may, for example, be directly connected to the liquid path of the system 100 (e.g., as shown by the directional lines), while the second volume 124 may only be hydraulically coupled via a capillary tube 126 to the first volume 122. In some embodiments, the utilization of the dual-volumes 122, 124 connected via the capillary tube 126 may facilitate gas and/or bubble containment in the system 100. The second volume 124 may, for example, contain both the liquid and a gas (e.g., a gas bubble). In some embodiments, the capillary tube 126 may permit the liquid to flow between the two volumes 122, 124 as needed, while it may also substantially prevent the gas from entering the first volume 122 (and thus the liquid flow path of the system 100).

The liquid may then, for example, be circulated by the pump 112 and/or be drawn from the first volume 122 of the reservoir 120 by the pump 112. The liquid may then proceed (and/or be directed) back to the cold plate 106 to remove more heat from the cold plate 106 (e.g., by allowing heat to transfer from the cold plate 106 into the cooled liquid). In some embodiments, the reservoir 120 may be disposed along and/or connected to any portion of the liquid flow path of the system 100. While the pump 112 is shown in FIG. 1 as directing the liquid directly into the reservoir 120 (and/or the first volume 122 thereof), for example, the reservoir 120 may instead be disposed ahead of the pump 112 in the liquid flow path. In other words, the pump 112 may draw the liquid from the reservoir 120 (and/or the first volume 122 thereof). Other configurations that maintain the hydraulic connection of the reservoir 120 and/or the first volume 122 to the liquid flow path may also or alternatively be used without deviating from the scope of some embodiments.

Figure 2:
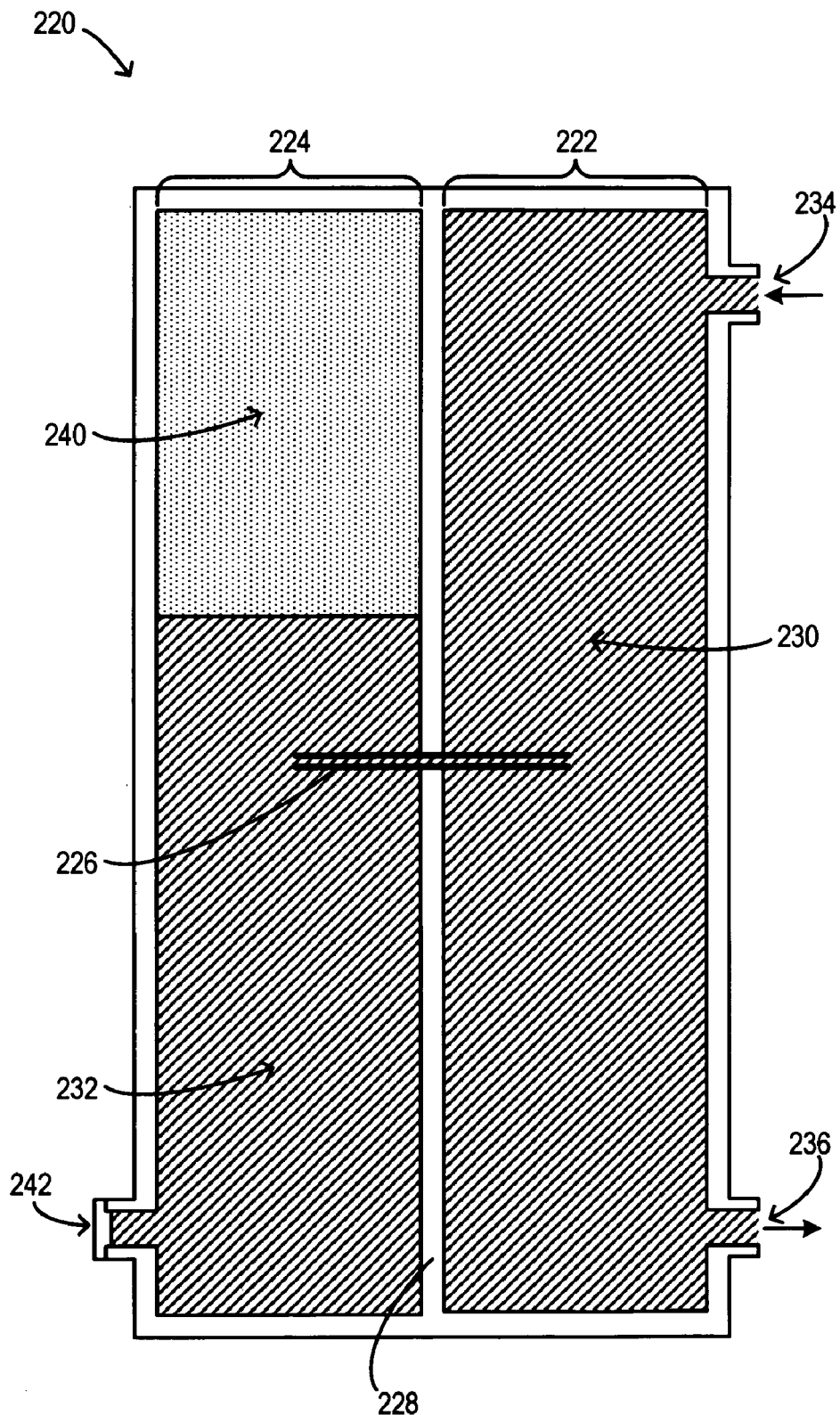
FIG. 2 is a block diagram of a reservoir according to some embodiments.

Turning in more detail to FIG. 2, a block diagram of a reservoir 220 according to some embodiments is shown. The reservoir 220 may, for example, be similar in configuration and/or functionality to the reservoir 120 described in conjunction with FIG. 1. In some embodiments, the reservoir 220 may comprise and/or define a first volume 222 and/or a second volume 224. The first and second volumes 222, 224 may, according to some embodiments, be hydraulically coupled and/or connected via a capillary tube 226. In some embodiments, the reservoir 220 may be split and/or segmented by a divider 228. The divider 228 may, for example, be any type of divider capable of separating the volumes 222, 224 that is or becomes known or practicable. The divider 228 may be a device inserted into and/or coupled to a single-cavity reservoir 220 (e.g., to define the two volumes 222, 224), for example, or may be a portion of a dual-cavity reservoir 220 that is manufactured, designed, forged, extruded, molded, and/or otherwise configured to define the two volumes 222, 224. In some embodiments, the first volume 222 may contain a fist volume of fluid and/or liquid 230. The second volume 224 may, according to some embodiments, contain a second volume of the liquid 232. The volumes of liquid 230, 232 may, for example, be hydraulically coupled, connected, and/or in communication via the capillary tube 226.

In some embodiments, the first volume of liquid 230 may also or alternatively be hydraulically coupled to and/or in communication with a fluid flow path associated with an electronics cooling system (such as the system 100). An inlet 234 may, for example, be coupled to the reservoir 220 and/or to the first volume 222 to provide the liquid to the first volume 222 (e.g., defining the first volume of liquid 230). The inlet 234 may, according to some embodiments, provide the liquid from an electronics cooling system. In some embodiments, the reservoir 220 and/or the first volume 222 may also or alternatively be coupled to an outlet 236. The outlet 236 may, for example, provide the liquid (e.g., from the first volume of liquid 230 and/or from the inlet 234) to the electronics cooling system. In other words, the first volume 222 may be or include a portion of a fluid flow path in an electronics liquid cooling system. In some embodiments, the inlet 234 and the outlet 236 may otherwise be disposed and/or configured to hydraulically couple the first volume of liquid 230 to the fluid flow path of the electronics liquid cooling system. The inlet 234 and the outlet 236 may be combined into a single hydraulic path and/or a single device, for example, or may be or include more paths, conduits, tubes, holes, and/or other hydraulic features than are shown in FIG. 2.

In some embodiments, the second volume 224 may also comprise a volume of gas 240. The second volume 224 may, for example, be partially filled with the second volume of liquid 232 and partially filled with the volume of gas 240 (e.g., a bubble of gas). According to some embodiments, the volume of gas 240 may facilitate the operation of the electronics liquid cooling system. As liquid is lost from a closed-loop system over time, for example, the volume of gas 240 may expand to allow and/or facilitate the second volume of liquid 232 to replenish quantities of liquid lost from the first volume of liquid 230 (and/or the fluid flow path coupled thereto). Quantities of the second volume of liquid 232 may, for example, travel through the capillary tube 226 and into the first volume 222 (and/or into the first volume of liquid 230).

According to some embodiments, the amounts of liquid and/or gas comprising the second volume of liquid 232 and/or the volume of gas 240, respectively, may be defined, determined, altered, increased, and/or decreased via a port 242 (shown capped and/or closed in FIG. 2). The port 242 may, for example, be a path into the second volume 224 that is accessible from outside of the second volume 242. The port 242 may, according to some embodiments, be utilized to establish initial sizes and/or ratios of the second volume of liquid 232 and/or of the volume of gas 240, and/or to re-charge and/or replenish the second volume of liquid 232 (e.g., to maintain the operating condition of an electronics liquid cooling system that has lost an amount of fluid).

In some embodiments, the utilization of the capillary tube 226 may substantially and/or entirely prevent the volume of gas 240 (and/or any portion thereof) from entering the first volume 222 and/or the first volume of liquid 230. The capillary tube 226 may, for example, allow quantities of the second volume of liquid 232 to pass into the first volume 222 and/or first volume of liquid 230 (and/or vise versa), while quantities of the volume of gas 240 may be prevented from entering the first volume 222 and/or first volume of liquid 230. The capillary forces of the liquid within the capillary tube 226 may, for example, substantially prevent the volume of gas 240 (and/or any portion thereof) from entering the capillary tube 226 (e.g., in the case that the end of the capillary tube disposed within the second volume 224 is exposed to the volume of gas 240). The capillary tube 226 may, according to some embodiments, be exposed to both the second volume of liquid 232 and the volume of gas 240. The capillary tube 226 may, for example, be "T" shaped and/or otherwise comprise multiple ends disposed within the second volume 224. In some embodiments, the end (and/or ends) of the capillary tube 226 disposed within the second volume 224 may also or alternatively be positioned to reduce the probability that the end of the capillary tube 226 may come in contact with the volume of gas 240. In the orientation of the reservoir 220 shown in FIG. 2, for example, the volume of gas 240 resides higher (as the gas may generally be substantially less dense than the liquid) than the second volume of liquid 232, maintaining the end of the capillary tube 226 within the second volume of liquid 232. The volume of gas 240 may, according to some embodiments, be substantially separated from the end of the capillary tube 226 in any number of arrangements and/or configurations.

As shown in FIG. 3A, FIG. 3B, FIG. 3C, and FIG. 3D, for example, block diagrams of a reservoir 320 according to some embodiments are shown. The reservoir 320 may, for example, be similar in configuration and/or functionality to the reservoirs 120, 220 described in conjunction with any of FIG. 1 and/or FIG. 2 herein. The reservoir 320 may comprise and/or define, for example, a first volume 322 and/or a second volume 324. In some embodiments, the two volumes 322, 324 may be hydraulically connected via a capillary tube 326 and/or may be separated by a divider 328. The capillary tube 326 may, for example, be the sole hydraulic path connecting the two volumes 322, 324.

In some embodiments, the first volume 322 may contain a first volume of liquid 330 and/or the second volume 324 may contain a second volume of liquid 332. The first volume of liquid 330 may, according to some embodiments, be in communication with and/or be hydraulically coupled to a fluid flow path of an electronics liquid cooling system (e.g., the system 100). For example, an inlet 334 and/or an outlet 336 may be coupled to the first volume 322 and/or to the first volume of liquid 330. The inlet 334 and the outlet 336 may, in some embodiments, be or include portions of a fluid flow path associated with the electronics liquid cooling system. The inlet 334 and/or the outlet 336 may, for example, connect to a heat exchanger, pump, and other component (not shown in FIG. 3A, FIG. 3B, FIG. 3C, or FIG. 3D) of an electronics liquid cooling system.

Figure 3A:
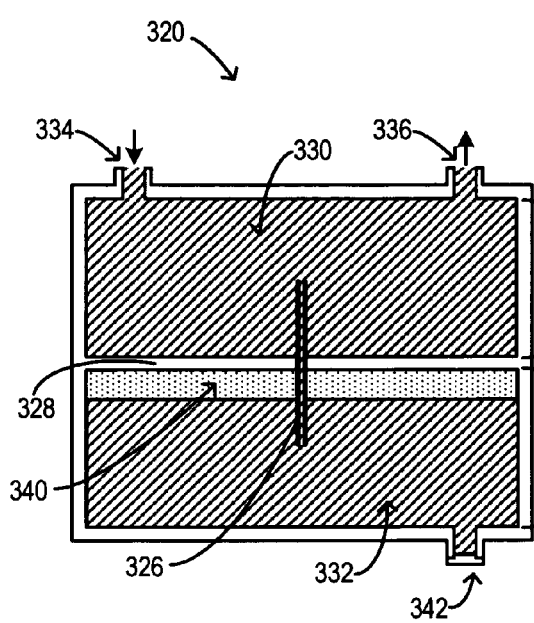
FIG. 3A, FIG. 3B, FIG. 3C, and FIG. 3D are block diagrams of a reservoir according to some embodiments.

According to some embodiments, the second volume 324 may also contain a volume of gas 340. The volume of gas 340 may, for example, be disposed within an upper portion of the second volume 324 (e.g., at least because the gas may be less dense than the liquid). FIG. 3A, for example, shows the reservoir 320 in an orientation where the first volume 322 is on top of the second volume 324 and the capillary tube 326 extends vertically between the two volumes 322, 324. In such a configuration, the volume of gas 340 may, for example, be oriented as shown in FIG. 3A. In some embodiments (e.g., as shown), the amount of the volume of gas 340 may be determined and/or established to cause an end of the capillary tube 326 to be disposed within the second volume of liquid 332 (e.g., as opposed to being exposed to and/or disposed within the volume of gas 340).

In such a manner, for example, the volume of gas 340 may be substantially prevented from coming in contact with and/or potentially entering the capillary tube 326. The capillary forces within the capillary tube 326 may also or alternatively facilitate and/or cause the liquid to travel between the two volumes 322, 324 (e.g., wicking quantities of the second volume of liquid 332 into the first volume of liquid 330) as is required (e.g., in relation to liquid pressure forces associated with the fluid flow path of the electronics liquid cooling system). The reservoir 320 may also or alternatively comprise a port 342. In the first orientation of FIG. 3A, the port 342 may, for example, be utilized to drain liquid from and/or add liquid to the second volume of liquid 332 and/or may be utilized to add gas to the volume of gas 340 (e.g., which would travel as bubbles from the port 342 up into the volume of gas 340).

Figure 3B:
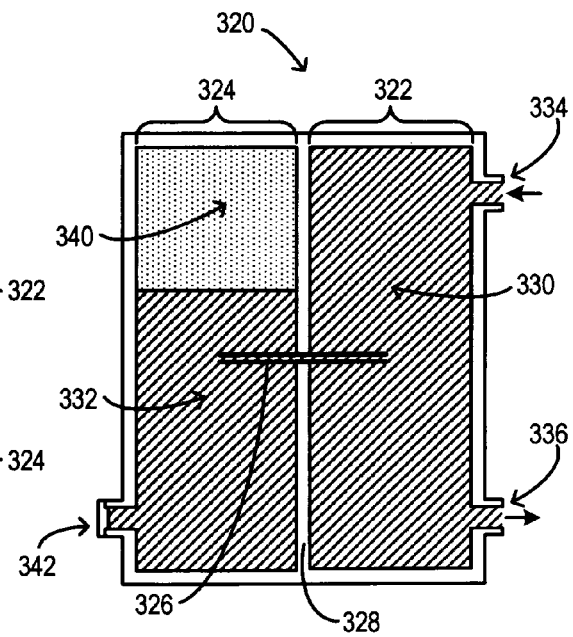

Other configurations and/or orientations of the reservoir 320, the capillary tube 326, and/or the size of the volume of gas 340 may also or alternatively be utilized to isolate the volume of gas 340 from the first volume 322. As shown in FIG. 3B, for example, a side-by-side orientation of the two volumes 322, 324 with a horizontal capillary tube 326 may be utilized. In such a configuration, the volume of gas 340 may be sized substantially as shown, for example, to isolate the volume of gas 340 from the end of the capillary tube 326. Further, similar to the functionality of the port 342 of FIG. 3A, the port 342 as oriented in FIG. 3B may be utilized to drain liquid from and/or add liquid to the second volume of liquid 332 and/or may be utilized to add gas to the volume of gas 340.

Figure 3C:
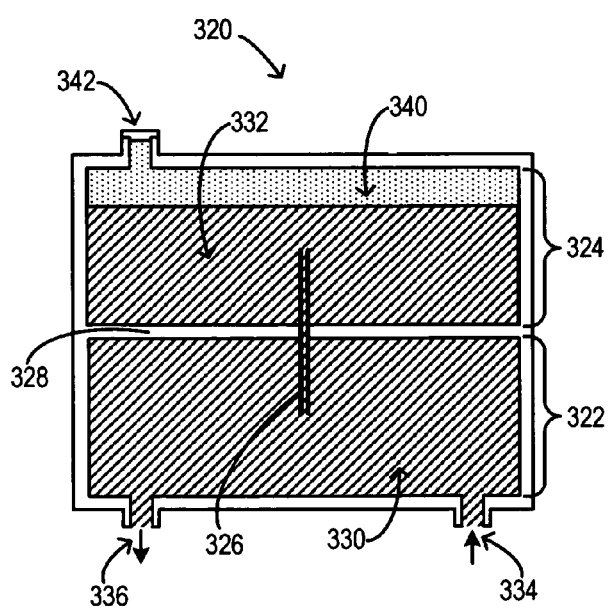
Figure 3D:
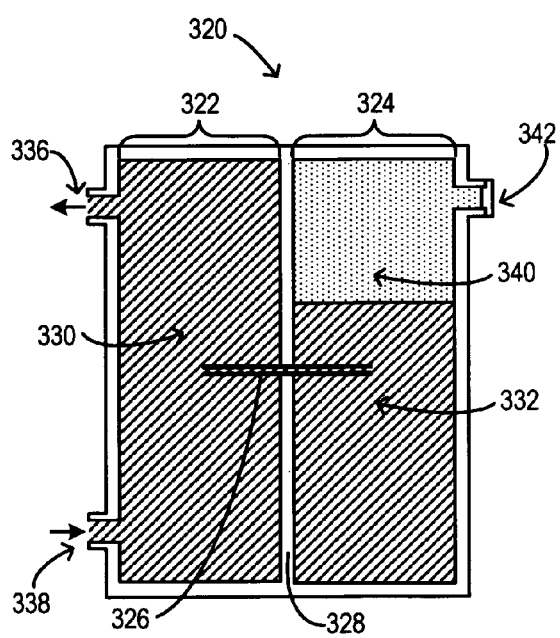

According to some embodiments (as shown in FIG. 3C for example), the second volume 324 may be situated on top of and/or above the first volume 322, with the capillary tube 326 extending vertically between the two volumes 322, 324. The reservoir 320 may also or alternatively be oriented in a side-by-side configuration of the two volumes 322, 324 with a horizontal capillary tube 326 (as shown in FIG. 3D), yet with the port 342 disposed on an upper portion of the second volume 324. In such configurations, for example, the volume of gas 340 may be maintained away from the end of the capillary tube 326 that is disposed within the second volume 324. The port 342 may also be utilized in such configurations to add and/or remove gas from the volume of gas 340 and/or to add liquid to the second volume of liquid 332.

In some embodiments, such as in the case that the electronics liquid cooling system with which the reservoir 320 is associated may be mobile and/or may otherwise change configurations (e.g., may be stored and/or transported upside down and/or on a side), the reservoir 320 may be oriented in any configuration (e.g., as shown in any of FIG. 3A, FIG. 3B, FIG. 3C, and/or FIG. 3D) that is or becomes practicable. The location and/or dimensions of the capillary tube 326 may, for example, be determined to reduce the probability that the volume of gas 340 may come in contact with an end of the capillary tube 326. In some embodiments (such as shown), the capillary tube 326 may be disposed through an area near and/or at the center of the divider 328 and/or may extend through about one-half of the second volume 324. In such a configuration, for example, the volume of gas 340 may be substantially isolated from the end of the capillary tube 326 in any of a plurality of orientations of the reservoir 320.

Figure 4:
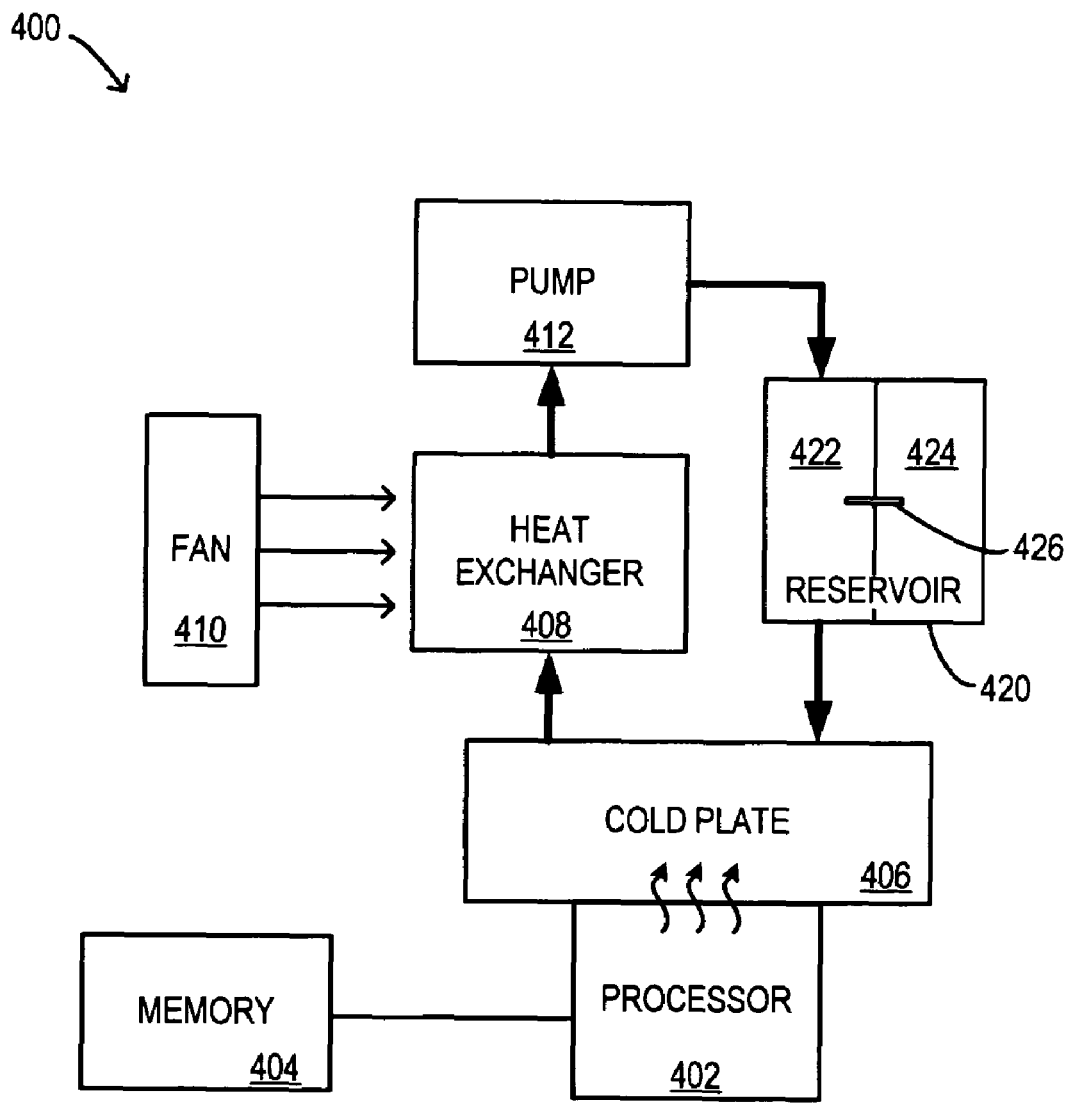
FIG. 4 is a block diagram of a system according to some embodiments.

Turning to FIG. 4, a block diagram of a system 400 according to some embodiments is shown. In some embodiments, the system 400 may be similar to the system 100 described in conjunction with FIG. 1. The system 400 may comprise, for example, a processor 402, a memory 404, a cold plate 406, a heat exchanger 408, a fan 410, a pump 412, and/or a reservoir 420. The reservoir 420 may, in accordance with some embodiments, comprise and/or define a first volume 422, a second volume 424, and/or a capillary tube 426. According to some embodiments, the components 402, 406, 408, 410, 412, 420, 422, 424, 426 of the system 400 may be similar in configuration and/or functionality to the similarly-named components described in conjunction with any of FIG. 1, FIG. 2, FIG. 3A, FIG. 3B, FIG. 3C, and/or FIG. 3D. In some embodiments, fewer or more components than are shown in FIG. 4 may be included in the system 400.

The processor 402 may be or include any number of processors, which may be any type or configuration of processor, microprocessor, and/or micro-engine that is or becomes known or available. In some embodiments, other electronic and/or electrical devices may be utilized in place of or in addition to the processor 402. The processor 402 may, for example, be or include any device, object, and/or component that generates, stores, and/or requires removal of heat. According to some embodiments, the processor 402 may be an XScale® Processor such as an Intel® PXA270 XScale® processor. The memory 404 may be or include, according to some embodiments, one or more magnetic storage devices, such as hard disks, one or more optical storage devices, and/or solid state storage. The memory 404 may store, for example, applications, programs, procedures, and/or modules that store instructions to be executed by the processor 402. The memory 404 may comprise, according to some embodiments, any type of memory for storing data, such as a Single Data Rate Random Access Memory (SDR-RAM), a Double Data Rate Random Access Memory (DDR-RAM), or a Programmable Read Only Memory (PROM).

According to some embodiments, the reservoir 420 may comprise the two volumes 422, 424 hydraulically coupled via the capillary tube 426 to substantially isolate a volume and/or bubble of gas from the fluid flow path of the system 400 (e.g., represented by the directional lines shown in FIG. 4). As described in conjunction with FIG. 1, FIG. 2, FIG. 3A, FIG. 3B, FIG. 3C, and FIG. 3D, for example, the capillary tube 426 may be oriented and/or configured to substantially avoid contact between the gas and an end of the capillary tube 426. The capillary tube 426 may also substantially and/or entirely prevent the gas from entering the capillary tube 426 even in the case that the gas is exposed to the end of the capillary tube 426. The capillary forces associated with the liquid and/or the capillary tube 426 may, for example, form a liquid barrier that prevents the gas from traveling into the first volume 422.

In such a manner, for example, the gas in the system 400 may be isolated from the fluid flow path to prevent cavitation and/or noise, prevent and/or reduce the likelihood of pump prime loss, and/or prevent and/or diminish potential thermal interferences, while at the same time still being able to provide benefits to the system 400. The gas may, for example, expand to allow liquid from the second volume 424 to enter the first volume 422 to replenish quantities of the liquid lost by the system 400. Similarly, the gas may be compressed by the liquid in the second volume 424 to accommodate liquid form the first volume 422 in the case that the liquid in the system 400 expands (e.g., due to thermal and/or environmental events). In other words, the dual-volume 422, 424 reservoir 420 with the connecting capillary tube 426 may allow a gas bubble to be utilized to provide benefits to the system 400 while the gas bubble itself is maintained in substantial isolation from the fluid flow paths of the system 400.

The several embodiments described herein are solely for the purpose of illustration. Other embodiments may be practiced with modifications and alterations limited only by the claims.

What is claimed is:

1. A system, comprising:
    a first volume to contain a liquid;
    a second volume to contain the liquid and a gas;
    a capillary tube configured to hydraulically couple the first and second volumes;
    an inlet coupled to the first volume to receive the liquid from an electronics cooling system; and
    an outlet coupled to the first volume to provide the liquid to the electronics cooling system the capillary tube comprises a first end disposed within the first volume and a second end disposed within the second volume.

2. The system of claim 1, wherein the second end of the capillary tube is configured to be exposed to the liquid within the second volume.

3. The system of claim 2, wherein the second end of the capillary tube is configured to substantially avoid exposure to the gas within the second volume.

4. The system of claim 1, wherein an amount of the gas within the second volume is determined to substantially prevent exposure of the second end of the capillary tube to the gas within the second volume.

5. The system of claim 1, wherein the capillary tube is filled with the liquid.

6. The system of claim 1, wherein the capillary tube is further configured to substantially prevent the gas within the second volume from entering the first volume.

7. The system of claim 1, wherein the first and second volumes are defined by a reservoir.

8. The system of claim 7, wherein the reservoir defines a single cavity and comprises a divider separating the cavity to define the first and second volumes.

9. The system of claim 8, wherein the capillary tube passes through the divider.

10. The system of claim 9, wherein the first and second volumes are substantially symmetrical in shape.

11. The system of claim 10, wherein the capillary tube passes substantially through the center of the divider.

12. The system of claim 1, further comprising:
    a fluid path coupled to the second volume.

13. The system of claim 12, wherein the fluid path is operable to add or remove the liquid or the gas from the second volume.

14. The system of claim 1, wherein the first volume is further hydraulically coupled to a liquid cooling path of the electronics cooling system.

15. The system of claim 1, wherein the first volume comprises a portion of a liquid cooling path of the electronics cooling system.

16. A system, comprising:
    a processor;
    a double data rate memory coupled to the processor;
    a liquid cooling device to remove heat from the processor; and
    a reservoir hydraulically coupled to the liquid cooling device, the reservoir comprising:
        a first volume to contain a liquid;
        a second volume to contain the liquid and a gas;
        a capillary tube configured to hydraulically couple the first and second volumes;
        an inlet coupled to the first volume to receive the liquid from the liquid cooling device; and
        an outlet coupled to the first volume to provide the liquid to the liquid cooling device the capillary tube comprises a first end disposed within the first volume and a second end disposed within the second volume.

17. The system of claim 16, wherein the liquid cooling device comprises at least one of a cold plate, a heat exchanger, or a pump.

18. The system of claim 16, wherein the second end of the capillary tube is configured to be exposed to the liquid within the second volume and the second end of the capillary tube is configured to substantially avoid exposure to the gas within the second volume.

* * * * *